United States Patent

Koshimizu

[11] Patent Number: 5,997,687
[45] Date of Patent: Dec. 7, 1999

[54] PLASMA PROCESSING APPARATUS

[75] Inventor: Chishio Koshimizu, Yamanashi-ken, Japan

[73] Assignee: Tokyo Electron Limited, Tokyo, Japan

[21] Appl. No.: 08/907,418

[22] Filed: Aug. 7, 1997

[30] Foreign Application Priority Data

Aug. 23, 1996 [JP] Japan ................................ 8-241313

[51] Int. Cl.$^6$ .................................................. H05H 1/00
[52] U.S. Cl. .................. 156/345; 118/723 E; 315/111.21
[58] Field of Search ........................ 156/345; 118/723 E; 315/111.21

[56] References Cited

U.S. PATENT DOCUMENTS 5,698,062  12/1997  Sakamoto et al. ...................... 156/345
5,849,136  12/1998  Mintz et al. ............................. 156/345

FOREIGN PATENT DOCUMENTS 2-129377  5/1990  Japan .
4-180569  6/1992  Japan .
6-17102   1/1994  Japan .

*Primary Examiner*—Thi Dang
*Attorney, Agent, or Firm*—Oblon, Spivak, McClelland, Maier & Neustadt, P.C.

[57] ABSTRACT

This invention relates to optimization of processing with a pulse plasma. The frequency at the initial period of rise of each pulse is shifted higher than that in the steady state in accordance with the ON timing of a plasma excitation RF power pulse. With this setting, the RF power pulse is matched to a high resonance frequency used when no plasma exists in a processing chamber, or a plasma is weak, thereby enhancing the ignition performance of the pulse plasma. In this invention, a biasing RF power pulse is controlled to adjust the maximum, minimum, or average value of a potential on the processing surface of a substrate to be a predetermined value or less. A means for this control includes a means for controlling the output waveform of the biasing RF power pulse, and a means for controlling the frequency of the biasing RF power pulse. By this control, the damage to the substrate due to collision of ions with the substrate is reduced, and uniform plasma processing is performed.

23 Claims, 4 Drawing Sheets

PLASMA PROCESSING APPARATUS

BACKGROUND OF THE INVENTION

The present invention relates to a plasma processing apparatus for performing plasma processing such as etching, ashing, or CVD processing for a substrate such as a semiconductor wafer or an LCD substrate.

As an apparatus for performing plasma processing such as etching for a substrate such as a semiconductor wafer or an LCD substrate, various plasma processing apparatuses including a parallel plate plasma processing apparatus, an ECR (Electron Cyclotron Resonance) plasma processing apparatus, and an inductive coupled plasma processing apparatus have conventionally been known.

The parallel plate plasma processing apparatus will be exemplified. The parallel plate plasma processing apparatus comprises a processing chamber arranged in an airtight processing vessel, upper and lower electrodes arranged opposite to each other within the processing chamber, and a power supply for applying an RF power having a predetermined frequency to either one of the upper and lower electrodes. A predetermined processing gas introduced into the processing chamber is converted into a plasma by the RF power to perform predetermined plasma processing for a substrate with this plasma.

In this plasma processing apparatus, when the RF power having a predetermined frequency is continuously applied to either one of the upper and lower electrodes, the electron temperature in the processing chamber increases to excessively progress dissociation of the processing gas. As a result, the selectivity and the etching rate in a hole undesirably decrease. In the conventional processing apparatus, increases in selectivity and etching rate in the hole are limited. To cope with the increase in integration degree and size reduction of recent semiconductor devices, demand arises for a technique capable of micropatterning (e.g., hole processing with a high aspect ratio). To meet this demand, the above limitations must be overcome.

An improved apparatus forms an RF pulse train (pulse train formed by ON/OFF-controlling or high-level/low-level-controlling an RF signal, and each pulse in the pulse train including an RF component). This RF pulse train is amplified to form an RF power pulse train, which is applied to either one of the upper and lower electrodes to form a pulse plasma (plasma formed intermittently).

This apparatus can form an intermittent pulse plasma in the processing chamber, suppress an increase in electron temperature within the processing chamber, and dissociate a processing gas at an arbitrary rate. Therefore, the selectivity and the etching rate in the hole can be increased.

While no RF power is supplied, no plasma exists between the upper and lower electrodes. While the RF power is at low level, or after glow discharge occurs, the plasma density between the upper and lower electrodes is low. During these periods, since the capacitance between the upper and lower electrodes is smaller than that in occurrence of a plasma, the resonance conditions differ from those in occurrence of a plasma. For this reason, the resonance conditions are not matched in the conventional apparatus wherein the RF power pulse train having a predetermined frequency is applied to the upper or lower electrode. The plasma generation efficiency decreases during the above periods, resulting in a low plasma processing rate.

Immediately after each pulse of the RF power pulse train rises, or during the OFF period, the impedance between the upper and lower electrodes abruptly changes. A conventional matching circuit cannot follow this abrupt change in impedance, and a reflected wave generated upon application of the RF power to the electrode is difficult to relax.

In the conventional apparatus, during a period immediately after each pulse of the RF power pulse train rises, the electron temperature may abruptly increase to damage the substrate.

A plasma processing apparatus wherein a pulse plasma is uniformly drawn into a substrate by applying a biasing RF power pulse train to a lower electrode mounting the substrate thereon is proposed. In this plasma processing apparatus, when each pulse of a plasma generation RF power pulse train rises or is in the OFF state, the maximum and minimum voltage values ($V_{PP}$) of the RF power applied to the substrate, or the average voltage value ($V_{DC}$) of the RF power applied to the substrate abruptly changes to damage the substrate such that a gate oxide film of a semiconductor wafer is destructed.

BRIEF SUMMARY OF THE INVENTION

It is an object of the present invention to improve a conventional plasma processing apparatus in which an RF signal is ON/OFF-controlled or high-level/low-level-controlled to form an RF pulse train, the RF pulse train is amplified to form an RF power pulse train, and the RF power pulse train is applied to a plasma source to form an intermittent pulse plasma.

It is another object of the present invention to solve and reduce the above-described problems in the conventional plasma processing apparatus.

Particularly, it is still another object of the present invention to smoothly ignite and excite a plasma in the conventional plasma processing apparatus.

It is still another object of the present invention to solve the problem of a decrease in plasma processing rate.

It is still another object of the present invention to solve the problem of the damage to a substrate in plasma processing.

The invention disclosed in claims 1 to 23 solves the above problems by various features and improvements as follows in a plasma processing apparatus comprising an RF power source for one of ON/OFF-controlling or high-level/low-level-controlling an RF signal to generate an RF pulse train, amplification means for amplifying the RF pulse train from the RF power source to generate an RF power pulse train, a plasma source from which a pulse plasma is excited by applying the RF power pulse train from the amplification means to the plasma source, and a processing chamber having a susceptor (i.e., a lower electrode) for placing the plasma source and a substrate in the chamber to perform plasma processing for the substrate placed on the susceptor with the pulse plasma from the plasma source.

The first feature and improvement of the present invention is to arrange frequency control means for setting a frequency of at least one RF pulse of the RF pulse train from the RF power supply in a predetermined initial period of rise of an envelope waveform of the RF pulse to be higher than a frequency after the predetermined period.

With regard to the first feature and improvement, the present invention is also characterized by comprising, as means for setting the frequency of the RF pulse in the above manner, means for controlling the frequency so as to gradually decrease from a high frequency to the frequency after the predetermined period.

According to the first feature and improvement, the frequency of the RF power at one or both of the period when the capacitance of the plasma source is small, i.e., the first pulse of the RF pulse train rises to ignite a plasma, and the period when each of subsequent pulses rises to excite the plasma is shifted to a frequency higher than the frequency in the steady state when a pulse plasma is generated, so that the resonance conditions are easily matched. A mechanical matching circuit employed in the plasma processing apparatus is a circuit having a relatively low speed following changes in conductance of the plasma source. However, since the resonance conditions are matched independently of this matching circuit, the pulse plasma can be smoothly ignited and excited to uniformly generate pulse plasmas at desired intervals and perform stable plasma processing.

The second feature and improvement of the present invention is to control a biasing RF power to be applied to the susceptor mounting the substrate thereon so as to adjust one of the maximum, minimum, and average value of a potential corresponding to a potential on the processing surface of the substrate (i.e., a potential on the processing surface of the substrate or a potential corresponding to the potential) to be a predetermined value or less.

With regard to the second feature and improvement, the present invention is also characterized in that the predetermined value is a value set from a viewpoint of reducing damage to the substrate due to collision of ions in the plasma.

With regard to means for realizing the "predetermined value or less", the present invention is also characterized in that, when a biasing RF power having a predetermined amplitude is applied to the susceptor, the biasing RF power is controlled to have an envelope waveform similar to a relatively inverted waveform in response to an uneven change in potential generated on the processing surface of the substrate or potential corresponding to the generated potential, and in that the frequency of the biasing RF power is controlled.

According to the second feature, the phenomenon that the potential on the processing surface of the substrate abruptly changes is relaxed during the period when the first pulse of the RF power pulse train to be applied to the plasma source rises to ignite a plasma, and during the period when each of subsequent pulses rises to excite the plasma, so that the damage to the substrate is reduced.

In addition to the above features and improvement, the present invention is characterized in that, in a plasma processing apparatus having two or more plasma sources, RF power pulse trains having shifted timings are applied to the respective plasma sources, and in that the biasing RF power pulse train having a predetermined delay from the RF power pulse train to be applied to the plasma source is applied.

With the former feature, the RF power pulse to be applied to the two or more plasma sources can be prevented from hunting.

With the latter feature and improvement, after a pulse plasma is generated under optimal conditions in the processing chamber, the pulse plasma can be efficiently drawn into the substrate to effectively execute uniform plasma processing.

The present invention can be constituted by employing either one of these features, or constituted by two or more features of them.

BRIEF DESCRIPTION OF THE SEVERAL VIEWS OF THE DRAWING

The accompanying drawing, which is incorporated in and constitutes a part of the specification, illustrates presently preferred embodiments of the invention and, together with the general description given above and the detailed description of the preferred embodiments given below serves to explain the principles of the invention.

DETAILED DESCRIPTION OF THE INVENTION

Figure 1:
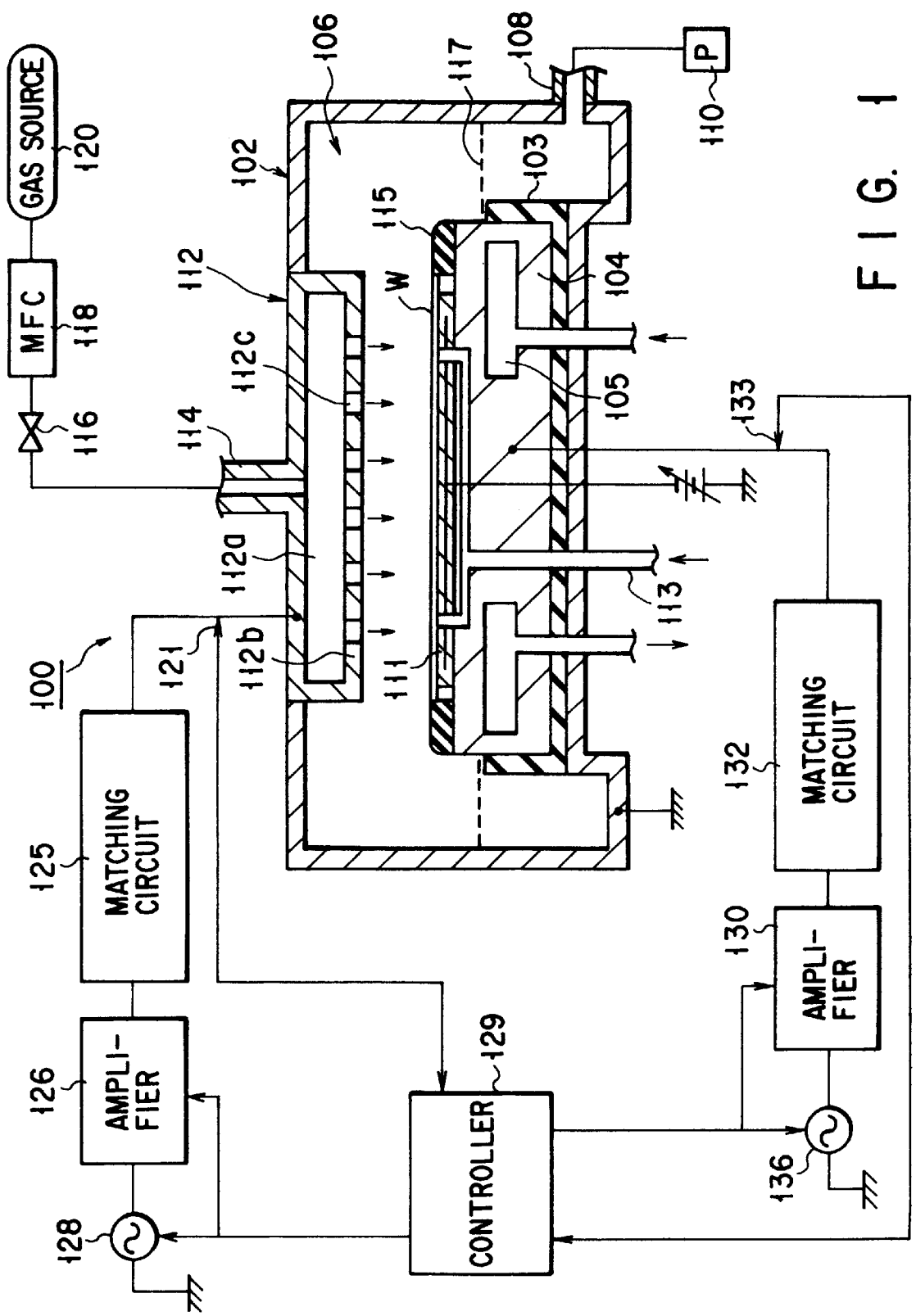
FIG. 1 is a schematic sectional view showing an embodiment of a plasma processing apparatus to which the present invention can be applied.

The present invention is applicable to various types of plasma processing apparatuses including a parallel plate etching apparatus. An embodiment wherein the present invention is applied to the parallel plate etching apparatus will be described in detail below with reference to the several views of the accompanying drawing.

In the following description, the same reference numerals denote constituent elements having almost the same functions and arrangements in order to omit a repetitive description.

Referring to FIG. 1, a processing vessel 102 of a parallel plate etching apparatus 100 is formed from a conductive material (e.g., aluminum having an anodized surface), and has an almost cylindrical shape. A susceptor 104 for placing a substrate (e.g., a semiconductor wafer), and a processing chamber 106 for performing plasma processing for the substrate are arranged in the processing vessel 102.

An insulating support plate 103 formed from an insulating material (e.g., a ceramic) is arranged on the bottom portion of the processing chamber 106, and the susceptor 104 for the substrate is arranged on the insulating support plate 103. The susceptor 104 has an almost columnar shape, and is formed from a conductive material (e.g., anodized aluminum). An electrostatic chuck 111 for chucking the substrate is arranged on the susceptor 104. The susceptor 104 also functions as a lower electrode, and is applied with a biasing RF power pulse train from an RF power supply 136 through an amplifier 130 and a matching circuit 132.

A coolant circulation means 105 is arranged within the susceptor 104 to cool a substrate W placed on the susceptor 104, thereby adjusting the temperature of the target processing surface of the substrate W to a predetermined temperature. Heat transfer gas supply holes (not shown) are substantially concentrically formed in the electrostatic chuck 111. A heat transfer gas (e.g., helium gas) is supplied to each heat transfer supply hole through a heat transfer gas supply pipe 113. The heat transfer gas is supplied to a small space formed between the substrate W and the electrostatic chuck 111 to increase the efficiency of heat transfer between the coolant circulation means 105 and the substrate W.

The peripheral edge portion of the upper end of the susceptor 104 has a focus ring 115 almost conforming to the outer peripheral shape of the substrate so as to surround the substrate W placed on the electrostatic chuck 111. The focus ring 115 is made from an insulating material (e.g., silica), and functions not to draw reactive ions and the like in the plasma. The reactive ions and the like are incident on only the substrate W inside the focus ring 115.

A exhaust ring 117 having a plurality of openings is formed between the susceptor 104 and the inner wall of the processing vessel 102 so as to surround the susceptor 104. The exhaust ring 117 functions to straighten a discharge flow. A processing gas and the like are uniformly discharged from the processing vessel 102.

A exhaust pipe 108 is connected to the side wall of the bottom portion of the processing chamber 106. An evacuation means 110 is connected to the other end of the exhaust pipe 108 through a valve or the like (not shown). The interior of the processing chamber 106 is kept at a predetermined reduced pressure (e.g., 1 to 100 mTorr) by the evacuation means 110.

An upper electrode 112 having an almost cylindrical shape is arranged at an upper wall portion, of the processing chamber 106, opposing the susceptor 104 (also serving as a lower electrode). The upper electrode 112 is made from a conductive material (e.g., aluminum having an anodized surface). A gas supply pipe 114 is connected to the upper electrode 112. The gas supply pipe 114 is connected to a gas supply source 120 through a valve 116 and a mass-flow controller (MFC) 118.

The upper electrode 112 has a hollow portion 112a therein. A surface 112b opposing the substrate W has a large number of gas discharge ports 112c. A processing gas (e.g., $C_4F_8$ gas) from the gas supply source 120 is introduced into the hollow portion 112a inside the upper electrode 112, and uniformly introduced into the processing chamber 106 through the gas discharge ports 112c.

An arrangement for applying a plasma generation/excitation RF power pulse train to the upper electrode 112 will be described. The upper electrode 112 is electrically connected to an RF pulse power supply 128 through a matching circuit 125 and an amplifier 126. An RF pulse train having a predetermined frequency and output value from the RF pulse power supply 128 is amplified by the amplifier 126. The RF power pulse train from the amplifier 126 is processed by the matching circuit 125 so as to match the resonance conditions in the processing chamber 106, and applied to the upper electrode 112. A sensor 121 for detecting the state of the RF power pulse train is arranged near the feeder distribution center of the upper electrode 112 applied with the RF power pulse train. A value detected by the sensor is feed back to a controller 129.

The controller 129 is connected to the RF power supply 128 and the amplifier 126 to control them. By this control, the RF power pulse train having the predetermined frequency and output value is formed by the RF power supply 128 and the amplifier 126, and applied to the upper electrode 112.

An arrangement for applying the biasing RF power pulse train to the lower electrode 104 will be described. The lower electrode 104 is electrically connected to the RF pulse power supply 136 through the matching circuit 132 and the amplifier 130. A biasing RF pulse train having a predetermined frequency and output value from the RF pulse power supply 136 is amplified by the amplifier 130. The biasing RF power pulse train from the amplifier 130 is applied to the lower electrode 104 through the matching circuit 132 for the resonance condition. The controller 129 is electrically connected to the amplifier 130 and the RF power supply 136 to form the biasing RF power pulse train having the predetermined frequency and output value while controlling the amplifier 130 and the RF power supply 136.

A sensor 133 for detecting the state of the RF power pulse train is arranged near the feeder distribution center of the lower electrode 104 applied with the biasing RF power pulse train. The sensor measures the maximum, minimum, or average value of the potential of the biasing RF power pulse train applied to the lower electrode 104. The measurement value is feed back to the controller 129. The controller 129 properly controls formation of the RF power pulses to be applied to the upper and lower electrodes 112 and 104 in accordance with the feed-back measurement value. Under the control of the controller 129, an optimal pulse plasma can be generated in the processing chamber 106 to uniformly process the substrate while reducing the damage to it.

In the embodiment shown FIG. 1, the sensor for measuring the maximum, minimum, or average value of the potential of the biasing RF power pulse train is arranged near the feeder distribution center of the lower electrode 104 applied with the biasing RF power pulse train. However, the installation position of the sensor, and the like are not limited to this embodiment.

More specifically, according to the present invention, the maximum, minimum, or average value of the potential appearing on the processing surface of the substrate W is controlled to a predetermined value or less to reduce the damage to the substrate W and attain uniform plasma processing. From this viewpoint, it is preferable to directly measure the plasma potential reflecting the ion energy above the processing surface of the substrate W. In the plasma apparatus of the embodiment shown in FIG. 1, the plasma potential is difficult to directly measure. For this reason, a potential around the feeder distribution center of the lower electrode 104 applied with the biasing RF power pulse train, or a value prepared by performing predetermined correction processing for the potential is used as a potential corresponding to the potential on the processing surface of the substrate W.

In addition to this measurement method, a potential measured by a sensor arranged near the lower surface of the substrate or a sensor arranged on the focus ring disposed around the substrate W, or a value prepared by performing predetermined correction processing for this potential can be used as a potential corresponding to the potential on the processing surface of the substrate W. Further, the intermediate potential of the plasma area above the processing surface of the substrate W can be measured by a proper sensor (e.g., an emissive probe, a spectrum analysis sensor using infrared absorption spectroscopy), and can be used similarly.

A control form of controlling the plasma generation/excitation RF power pulse train to be applied to the upper electrode 112, and the biasing RF power pulse train to be applied to the lower electrode 104 will be described in detail.

(1) Control of Plasma Generation/Excitation RF Power Pulse

Figure 2:
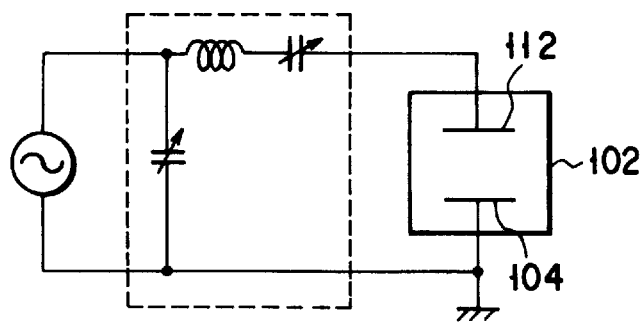
FIG. 2 is a schematic circuit diagram of the plasma processing apparatus shown in FIG. 1.

The plasma processing apparatus of the embodiment of the present invention shown in FIG. 1 is considered as an LC resonance circuit constituted by an inductance element (L) and a capacitance element (C), as schematically shown in FIG. 2. A resonance frequency f is obtained by f=½πL×C (Equation 1).

In a state wherein no plasma is generated and excited in the processing chamber 106, the space between the upper and lower electrodes 112 and 104 is in a high vacuum state, and the capacitance (C) is small. To the contrary, in a state wherein a plasma is generated and excited in the processing chamber 106, the space between the upper and lower electrodes 112 and 104 is rendered conductive by the plasma, and the apparent distance between the opposing electrodes is shortened to increase the capacitance (C). In this manner, the capacitance (C) between the two electrodes changes depending on the state of the space between the two electrodes of the plasma processing apparatus 100, and the resonance frequency f also changes. When no plasma is generated and excited, if an RF power pulse train matching the plasma generation/excitation state is applied to ignite a plasma, the plasma is difficult to ignite. Also when the OFF period between the respective pulses of the RF power pulse train is relatively long, or the plasma density decreases between the respective pulses, if the RF power pulse train matching the plasma generation/excitation state is applied to ignite a plasma, the plasma is difficult to ignite.

Figure 3A:
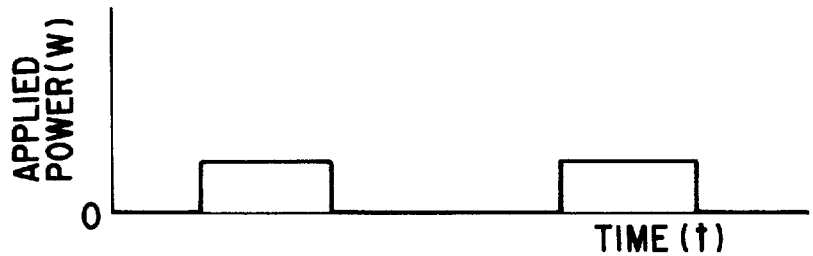
FIGS. 3A and 3B are timing charts showing the relationship between the ON timing of a plasma excitation RF pulse and its reflected wave.
Figure 3B:
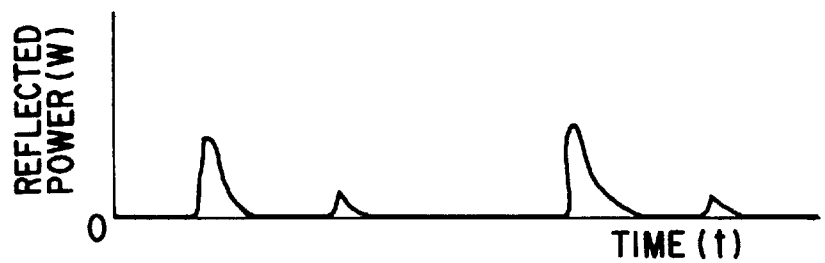

If an RF power pulse train shown in FIG. 3A is applied to the plasma processing apparatus, reflected waves are generated at the leading and trailing edges of the pulse, as shown in FIG. 3B. To excite a pulse plasma across the two electrodes by using the RF power pulse train, the matching circuit 125 must realize matching to optimal resonance conditions while removing the influence of the reflected wave. The matching circuit 125 is difficult to follow rapid changes in capacitance (C) between the two electrodes caused by the RF power pulse train because it comprises, as its constituent element, a mechanism for mechanically adjusting the inductance (L) and the capacitance (C). As a result, an RF power component which does not contribute to excitation of a plasma is generated to increase the power consumption. At the same time, the substrate W is damaged, and the uniformity of the processing is lowered due to variations in plasma density.

Figure 4A:
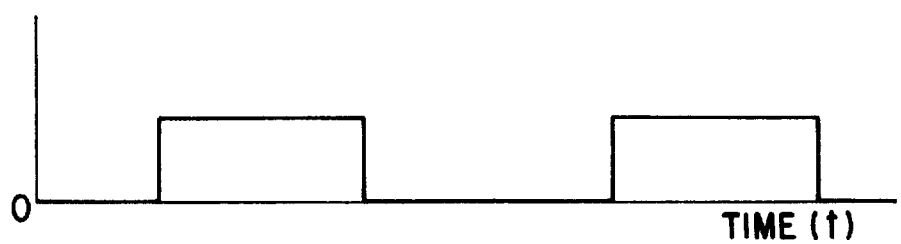
FIGS. 4A and 4B are timing charts showing a state wherein the frequency of each pulse of an RF pulse train from an RF power supply is controlled in the plasma processing apparatus to which the present invention is applied.
Figure 4B:
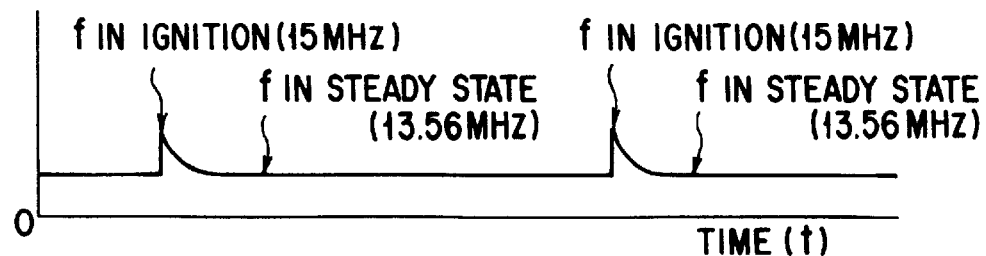

FIGS. 4A and 4B show an example wherein the frequency in a predetermined initial period of each of all the pulses of the RF power pulse train to be applied to the upper electrode 112 is shifted to a high frequency and gradually decreased to a steady frequency.

In this manner, according to the present invention, the frequency of the RF power pulse train to be applied to the upper electrode 112 is controlled by the controller 129 to shift the frequency in the predetermined initial period of rise of the envelope waveform of at least one RF pulse of the RF power pulse train rises to a frequency (e.g., 15 MHz) relatively higher than the steady frequency (e.g., 13.56 MHz) when the pulse plasma is excited.

With this arrangement, when no plasma is generated and excited in the processing chamber 106, or the plasma is weak, the frequency of the RF power pulse during the initial period is shifted higher in correspondence with the conditions for a small capacitance (C) between the two electrodes and a high resonance frequency. This shift facilitates matching of the resonance conditions during the initial period. Even if the followability of the matching circuit 125 is low, the ratio of the RF power which does not contribute to excitation of the plasma can be decreased, and the plasma can be easily ignited to increase the utilization efficiency of the RF power.

The above description is related to the arrangement wherein, in igniting and exciting each pulse plasma (i.e., ON control of each RF power pulse), the frequency of the RF power pulse is shifted to a frequency relatively higher than the steady frequency. However, the present invention is not limited to this embodiment. For example, depending on a processing content, an after glow plasma is excited upon completion of predetermined plasma processing. While this after glow plasma is excited, the plasma between the two electrodes is very weak. Also when the plasma is very weak, the plasma is difficult to ignite. According to the present invention, not only when no plasma exists between the two electrodes, but also when the plasma therebetween is weak, like excitation of the after glow plasma, the frequency of the RF power pulse is shifted to a relatively high frequency in accordance with the ignition timing of each pulse plasma to facilitate ignition of the plasma.

In the present invention, the frequency of each RF power pulse during this period is shifted to a high frequency. As a form for decreasing the high frequency to a steady low frequency, the high frequency can be gradually shifted to the low frequency, as shown in FIG. 4B. Alternatively, the high frequency may be shifted to the low frequency stepwise over one or more steps.

(2) Control of Biasing RF Power Pulse

Figure 5A:
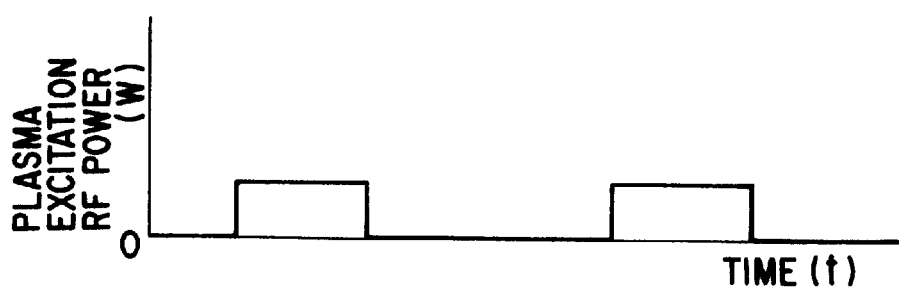
FIGS. 5A to 5E are timing charts showing the electron temperature of a plasma, the electron density, and the maximum and minimum values ($V_{pp}$) of the potential on the processing surface of a substrate in a case wherein a predetermined biasing RF power is applied to the lower electrode in a parallel plate plasma processing apparatus.
Figure 5B:
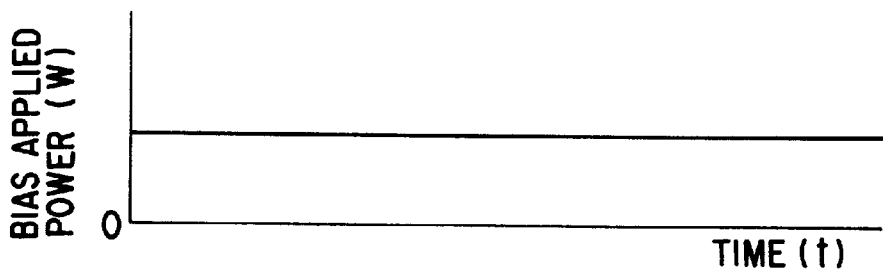
Figure 5C:
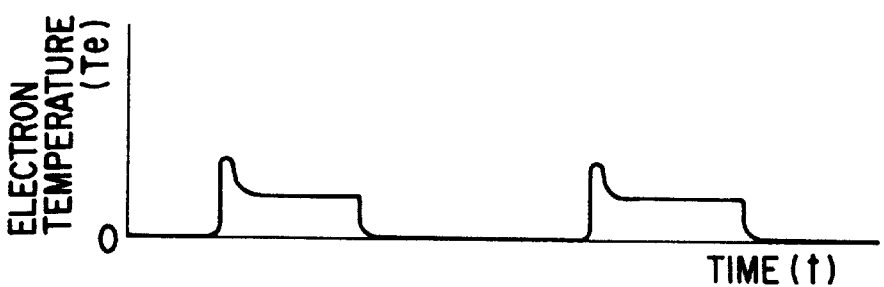
Figure 5D:
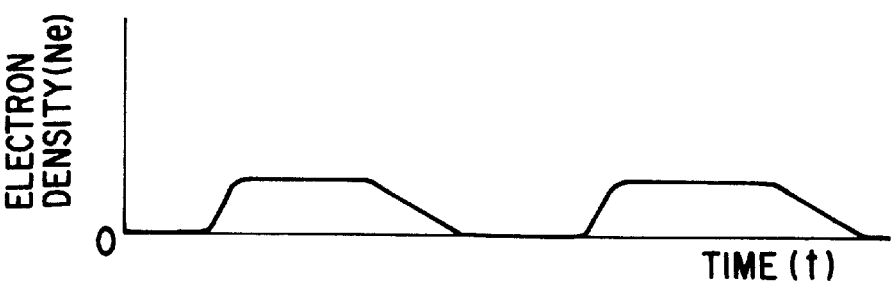
Figure 5E:
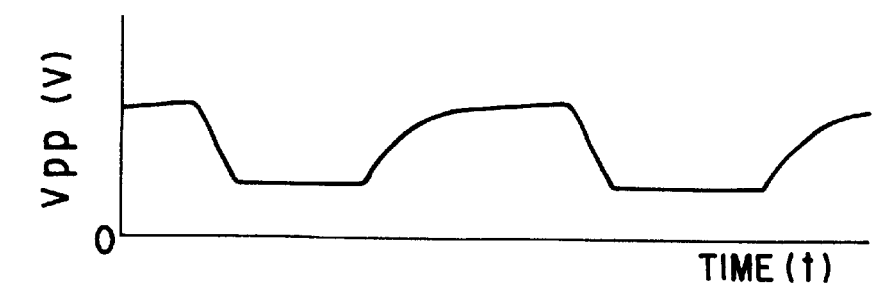

A case wherein an RF power pulse train having a predetermined frequency is applied to the upper electrode 112 (FIG. 5A) while a biasing RF power having a predetermined output is applied to the lower electrode 104 (FIG. 5B) will be described as a comparative example with reference to FIGS. 5A to 5E. In this case, the electron temperature in the processing chamber 106 abruptly increases in accordance with the ON timing of a plasma excitation RF power pulse, as shown in FIG. 5C. In response to this, the density of the pulse plasma in the processing chamber 106 exhibits a waveform represented using the electron density in FIG. 5D. During the OFF period of the plasma excitation RF power pulse, the plasma density decreases. For this reason, the potential around the processing surface of the substrate W abruptly increases, and, as shown in FIG. 5E, its maximum and minimum values ($V_{PP}$) change with phases opposite to the waveform of the electron density shown in FIG. 5D.

In the conventional apparatus wherein the biasing RF is held constant, like this case, ions may be abruptly accelerated by the increased $V_{PP}$ during the OFF period of the plasma excitation RF power pulse, and strongly collide with the processing surface of the substrate W to damage the substrate W.

The present invention solves this problem by controlling the biasing RF power so as to adjust the maximum, minimum, or average value of the potential on the processing surface of the substrate or a potential corresponding to this potential to be a predetermined value or less.

In FIGS. 6A to 6D, an RF power pulse train having a controlled frequency or output is applied to the upper electrode 112 (and the lower electrode 104).

The substrate W is placed on the susceptor 104 in the processing chamber 106 where predetermined process conditions are matched. An RF power pulse train (e.g., 2 kW in ON control, and 0 kW in OFF control) to the upper electrode 112 (FIG. 3A). The RF power supply 128 for oscillating the RF pulse train, and the amplifier 126 for amplifying the pulse are controlled by the controller 129. To enhance the ignition performance of the plasma according to the present invention, the frequency of the RF power pulse train during the rise (ON) period of the pulse is shifted to a frequency (e.g., 15 MHz) higher than the steady frequency (e.g., 13.56 MHz) (FIG. 4B). When a processing gas is introduced into the processing chamber 106, and the RF power pulse train is applied to the upper electrode 112, the pulse reacts with the processing gas in the processing chamber 106 to generate a pulse plasma. As indicated by the electron density in FIG. 5D, the pulse plasma is not generated at the same time as the rise (ON) of the RF power pulse, but generated with a time lag. The pulse plasma does not disappear at the same time with the fall (OFF) of the RF power pulse, but remains as an after glow plasma for a while.

In the apparatus of the present invention, the application timing of the biasing RF power pulse train to the lower electrode 104 is controlled in consideration of a time lag between the ON of the RF power pulse and generation of the pulse plasma. That is, when a pulse plasma is generated in a space between the upper and lower electrodes 112 and 104, the capacitance between the two electrodes increases to decrease $V_{PP}$. This change is detected as a change in $V_{PP}$ or $V_{DC}$ by the sensor 133, and fed back to the controller 129. The controller 129 controls the RF power supply 136 for oscillating the biasing RF pulse, and the amplifier 130 so as to adjust $V_{PP}$ or $V_{DC}$ to a predetermined value or less.

As this control form, the power value of the biasing RF power pulse is controlled to cancel the change (FIG. 5D) in electron density generated upon application of a predetermined biasing RF power to the lower electrode. More specifically, the biasing RF power is controlled between, e.g., 800 W and 0 W so as to have a waveform similar to a waveform (FIG. 6C) prepared by relatively inverting a change (FIG. 5E) appearing on the waveform of the detected $V_{PP}$ or $V_{DC}$. As a result, $V_{PP}$ or $V_{DC}$ can be kept constant, or the change in $V_{PP}$ or $V_{DC}$ can be relaxed, as shown in FIG. 6D. With this processing, the pulse plasma can be drawn into the substrate W within a predetermined energy range to perform plasma processing.

In the above embodiment, as a means for adjusting $V_{PP}$ or $V_{DC}$ to a predetermined value or less, the output waveform of the biasing RF power pulse is controlled. The present invention is not limited to this means, and can use any means capable of controlling the value $V_{PP}$ or $V_{DC}$.

Figure 6A:
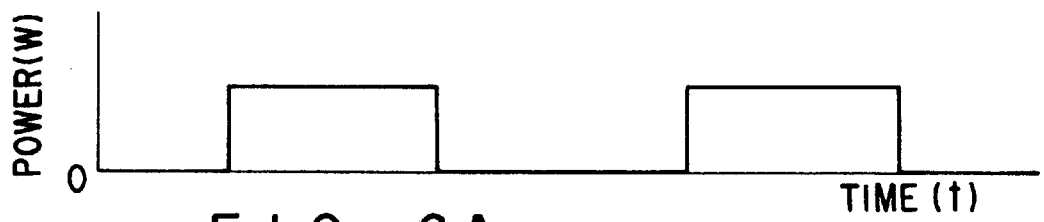
FIGS. 6A to 6D are timing charts showing a state wherein the output and frequency of the biasing RF power pulse train are controlled by the plasma processing apparatus based on the present invention.
Figure 6B:
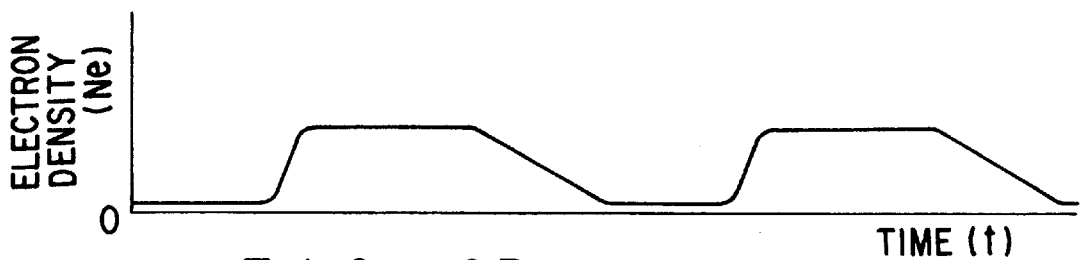
Figure 6C:
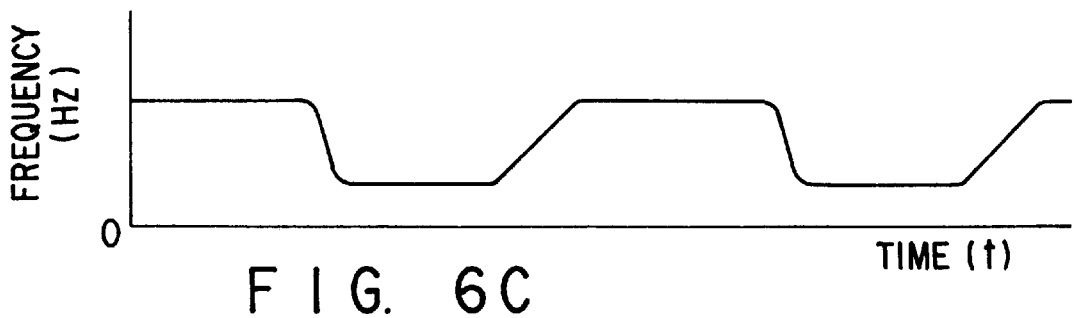
Figure 6D:
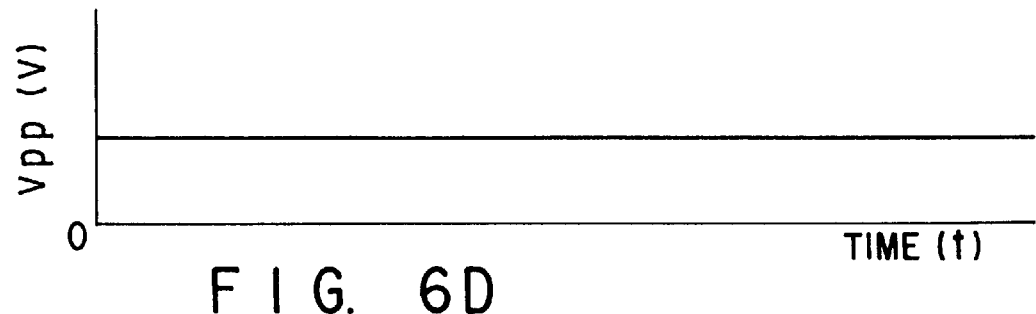

For example, the present invention can employ a means for controlling the frequency of the biasing RF power pulse to control the level of $V_{PP}$ or $V_{DC}$, as shown in FIG. 6C. Referring to FIG. 6C, the frequency of the biasing RF power pulse is controlled between, e.g., 1.2 MHz and 800 kHz to substantially have a waveform (FIG. 6B) similar to the change (FIG. 5E) appearing on the waveform of the detected $V_{PP}$ or $V_{DC}$. As a result, the level of $V_{PP}$ or $V_{DC}$ can be kept constant, or the change in $V_{PP}$ or $V_{DC}$ can be relaxed, as shown in FIG. 6D.

The above example exemplifies the means for controlling either one of the output power and frequency of the biasing RF power pulse train. However, both the output power and frequency can be controlled simultaneously.

In short, the gist of the present invention is to control the biasing RF power pulse so as to relax abrupt variations in ion energy on the processing surface of the substrate W caused by changes in impedance between the two electrodes in processing the substrate W with a plasma. As far as this purpose is achieved, the present invention is not limited to the above example, and can employ various means for controlling the biasing RF power pulse. Employment of these means also lies within the technical scope of the present invention.

As described above, in the plasma processing apparatus according to the embodiment of the present invention, the ignition performance of a pulse plasma can be enhanced by controlling the frequencies and outputs of a plasma excitation RF power pulse train and a biasing RF power pulse train to be applied to the upper and lower electrodes 112 and 104, respectively. If $V_{PP}$ or $V_{DC}$ is controlled to a predetermined value or less during plasma processing, a generated pulse plasma can be drawn into the substrate W with a predetermined energy, while reducing the damage to the substrate W, thereby performing uniform plasma processing.

The biasing RF power pulse train is preferably applied with a slight delay from the plasma excitation RF power pulse. As shown in FIG. 5D, the density of the pulse plasma excited by the plasma excitation RF power pulse train reaches the peak with a slight delay from the ON timing of the plasma excitation RF power pulse, and attenuates with a slight delay from the OFF timing of the plasma excitation RF power pulse. The pulse plasma can be more efficiently used by controlling the ON/OFF or high/low switching timing of the biasing RF power pulse in accordance with the change in plasma density.

Although the preferred embodiment of the present invention has been described with reference to the several views of the accompanying drawing, the present invention is not limited to this embodiment. Various changes and modifications are obvious to those skilled in the art within the technical spirit and scope disclosed in the claims. These changes and modifications are also incorporated in the technical spirit and scope of the present invention.

The above embodiment is related to the arrangement wherein the frequencies and outputs of the plasma excitation RF power pulse train and the biasing RF power pulse train are controlled simultaneously. However, the present invention is not limited to this embodiment. For example, either one of the plasma excitation RF power pulse train and the biasing RF power pulse train may be controlled in accordance with a process.

The above embodiment is related to the arrangement wherein changes in plasma excitation RF power pulse train and biasing RF power pulse train are detected by the sensors 121 and 133 and fed back to the controller 129. However, the present invention is not limited to this arrangement, and may employ an arrangement wherein a necessary control parameter is tentatively determined in advance to perform open-loop control on the basis of the control parameter.

Even when the open-loop control is to be performed, it is also possible that changes in plasma excitation RF power pulse train and biasing RF power pulse train are detected by the sensors 121 and 133, and control contents are changed over many steps or continuously so as to prevent the detected value from exceeding a predetermined value.

In the above-described embodiment, a pulse changing between the ON and OFF states is used for the plasma excitation RF power pulse train and the biasing RF power pulse train to be applied to the upper and lower electrodes 112 and 104, respectively. However, the present invention is not limited to the this embodiment, and a pulse changing between the high and low states can be used.

The above embodiment exemplifies an apparatus for etching a substrate by a parallel plate etching apparatus. However, the present invention is not limited to this apparatus, and is applicable to plasma processing apparatuses using various plasma sources for exciting a plasma by using an RF power pulse train, such as an ECR plasma source and an inductive coupled plasma source.

Figure 7:
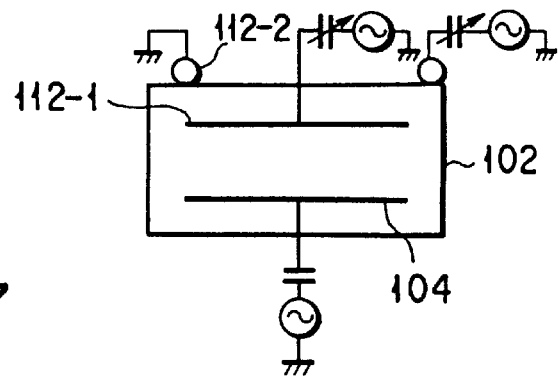
FIG. 7 is a schematic view of a parallel plate plasma processing apparatus having two plasma sources.

The present invention is not limited to a plasma processing apparatus having only one plasma source, and is applicable to a plasma processing apparatus having two or more plasma sources (FIG. 7). In this case, it is preferable that the application timings of RF pulses to the respective plasma sources be slightly shifted to avoid hunting.

Although the above embodiment exemplifies the case wherein the wafer is processed as the substrate W, the present invention is not limited to this case. For example, the present invention is applicable to an apparatus for etching an LCD glass substrate.

The above embodiment exemplifies the etching apparatus as a plasma processing apparatus. However, the present invention is not limited to the etching apparatus, and is applicable to various apparatuses for performing predetermined plasma processing for a substrate by using a pulse plasma, such as an ashing apparatus and a plasma CVD apparatus.

As has been described above, in the plasma processing apparatus according to the present invention, since the frequency is shifted in igniting each pulse plasma or exciting an after glow plasma to be relatively higher than the steady frequency when a pulse plasma is excited, the resonance conditions are easily matched. Even in the use of a matching circuit having a low followability, the pulse plasma can be easily ignited to generate uniform pulse plasmas at desired intervals.

Since the biasing RF power pulse train having an output controlled to prevent $V_{PP}$ or $V_{DC}$ from exceeding a predetermined value is applied to the susceptor for placing the substrate, uniform plasma processing can be performed for the substrate without damaging the substrate due to abrupt changes in $V_{PP}$ or $V_{DC}$ of the substrate in ON/OFF control of the pulse.

Since the biasing RF power pulse having a frequency controlled to substantially keep $V_{PP}$ or $V_{DC}$ constant is applied to the susceptor for placing the substrate, uniform plasma processing can be performed for the substrate without damaging the substrate due to abrupt changes in $V_{PP}$ or $V_{DC}$ of the substrate in ON/OFF control of the pulse.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A plasma processing apparatus comprising:
   an RF power supply for one of ON/OFF-controlling and high-level/low-level-controlling an RF signal to generate an RF pulse train;
   frequency control means, connected to said RF power supply, for setting a frequency of at least one RF pulse of the RF pulse train from said RF power supply during a predetermined initial period of rise of an envelope waveform of the RF pulse to be higher than a frequency after the predetermined period;
   amplification means for amplifying the RF pulse train controlled by said frequency control means to generate an RF power pulse train;
   a plasma source from which a pulse plasma is excited by applying the RF power pulse train from said amplification means to said plasma source; and
   a processing chamber having a susceptor for placing said plasma source and a substrate in said chamber to perform plasma processing for said substrate placed on said susceptor with the pulse plasma from said plasma source.

2. An apparatus according to claim 1, wherein said frequency control means is control means for setting, for an RF power pulse in igniting a plasma in the RF pulse train from said RF power supply, a frequency during the predetermined initial period of rise of the envelope waveform of the pulse to be higher than the frequency after the predetermined period.

3. An apparatus according to claim 1, wherein said frequency control means is control means for setting, for each RF power pulse of an RF pulse train after igniting a plasma in the RF pulse train from said RF power supply, a frequency during the predetermined initial period of rise of the envelope waveform of each pulse to be higher than the frequency after the predetermined period.

4. An apparatus according to claim 1, wherein said frequency control means is control means for setting, for an RF power pulse in igniting a plasma and each RF power pulse after igniting the plasma in the RF pulse train from said RF power supply, frequencies during the predetermined initial period of rise of the envelope waveform of each pulse to be higher than the frequency after the predetermined period.

5. An apparatus according to claim 1, wherein said frequency control means is control means for performing setting such that, during the predetermined initial period of rise of the envelope waveform of the RF pulse from said RF power supply, a frequency of the RF pulse is gradually decreased from a high frequency to the frequency after the predetermined period.

6. An apparatus according to claim 1, wherein said plasma source includes at least two plasma sources, and
   said frequency control means is control means for setting a frequency of at least one RF pulse of the RF pulse train from said RF power supply during the predetermined initial period of rise of the envelope waveform of the RF pulse to be higher than the frequency after the predetermined period, and setting timings of the RF power pulse train to be applied to said at least two plasma sources so as to shift the timings from each other.

7. A plasma processing apparatus comprising:
   an RF power supply for one of ON/OFF-controlling and high-level/low-level-controlling an RF signal to generate an RF pulse train;
   amplification means for amplifying the RF pulse train from said RF power source to generate an RF power pulse train;
   a plasma source from which a pulse is excited by applying the RF power pulse train from said amplification means to said plasma source;
   a processing chamber having a susceptor for placing said plasma source and a substrate in said chamber to perform plasma processing for said substrate placed on said susceptor with the pulse plasma from said plasma source;
   a biasing power source for supplying a biasing RF power to said susceptor; and
   biasing power control means, connected to said biasing power source, for setting the biasing RF power so as to adjust one of maximum, minimum, and average values of a potential corresponding to a potential on a processing surface of said substrate to be not more than a predetermined value.

8. An apparatus according to claim 7, wherein the predetermined value is a value set from a viewpoint of reducing damage to said substrate due to collision of ions in the plasma.

9. An apparatus according to claim 8, wherein said biasing power control means connected to said biasing power source is control means for setting the biasing RF power so as to adjust one of maximum, minimum, and average values of the potential corresponding to the potential on the processing surface of said substrate to be not more than the predetermined value by controlling the biasing RF power to have an envelope waveform similar to a relatively inverted waveform in response to an uneven change in potential corresponding to the potential generated on said processing surface of said substrate or potential corresponding to the generated potential when a biasing RF power having a predetermined amplitude is applied to said susceptor.

10. An apparatus according to claim 8, wherein said biasing power control means connected to said biasing power source is control means for setting the biasing RF power so as to adjust one of the maximum, minimum, and average values of the potential corresponding to the potential on the processing surface of said substrate to be not more than the predetermined value by controlling a frequency of the biasing RF power.

11. An apparatus according to claim 8, wherein said biasing power control means connected to said biasing power source is control means for setting a frequency of the biasing RF power so as to allow the biasing RF power to have an envelope waveform similar to a relatively inverted waveform in response to an uneven change in potential corresponding to the potential generated on said processing surface of said substrate when a biasing RF power having a predetermined amplitude is applied to said susceptor.

12. An apparatus according to claim 8, wherein said biasing power control means connected to said biasing power source is biasing power control means for controlling the biasing RF power so as to adjust one of the maximum, minimum, and average values of the potential corresponding to the potential on said processing surface of said substrate to be not more than the predetermined value, said bias power control means being control means for setting the biasing RF power to have a predetermined delay from an RF power pulse train to be applied to said plasma source.

13. A plasma processing apparatus comprising:
an RF power supply for one of ON/OFF-controlling and high-level/low-level-controlling an RF signal to generate an RF pulse train;
frequency control means, connected to said RF power supply, for setting a frequency of at least one RF pulse of the RF pulse train from said RF power supply during a predetermined initial period of rise of an envelope waveform of the RF pulse to be higher than a frequency after the predetermined period;
amplification means for amplifying the RF pulse train controlled by said frequency control means to generate an RF power pulse train;
a plasma source from which a pulse plasma is excited by applying the RF power pulse train from said amplification means to said plasma source;
a processing chamber having a susceptor for placing said plasma source and a substrate in said chamber to perform plasma processing for said substrate placed on said susceptor with the pulse plasma from said plasma source;
a biasing power source for supplying a biasing RF power to said susceptor; and
biasing power control means, connected to said biasing power source, for controlling the biasing RF power so as to adjust one of maximum, minimum, and average values of a potential corresponding to a potential on a processing surface of said substrate to be not more than a predetermined value.

14. An apparatus according to claim 13, wherein said frequency control means is control means for setting, for an RF power pulse in igniting a plasma in the RF pulse train from said RF power supply, a frequency during the predetermined initial period of rise of the envelope waveform of the pulse to be higher than the frequency after the predetermined period.

15. An apparatus according to claim 13, wherein said frequency control means is control means for setting, for each RF power pulse after igniting a plasma in the RF pulse train from said RF power supply, a frequency during the predetermined initial period of rise of the envelope waveform of each pulse to be higher than the frequency after the predetermined period.

16. An apparatus according to claim 13, wherein said frequency control means is control means for setting, for an RF power pulse in igniting a plasma and each RF power pulse after igniting the plasma from said RF power supply, frequencies during the predetermined initial period of rise of the envelope waveform of each pulse to be higher than the frequency after the predetermined period.

17. An apparatus according to claim 13, wherein said frequency control means is means for performing control such that, during the predetermined initial period of rise of the envelope waveform of the RF pulse from said RF power supply, a frequency of the RF pulse is gradually decreased from a high frequency to the frequency after the predetermined period.

18. An apparatus according to claim 13, wherein said plasma source includes at least two plasma sources, and
said frequency control means is control means for setting a frequency of at least one RF pulse of the RF pulse train from said RF power supply during the predetermined initial period of rise of the envelope waveform of the RF pulse to be higher than the frequency after the predetermined period, and setting timings of the RF power pulse train to be applied to said at least two plasma sources so as to shift the timings from each other.

19. An apparatus according to claim 13, wherein the predetermined value is a value set from a viewpoint of reducing damage to said substrate due to collision of ions in the plasma.

20. An apparatus according to claim 13, wherein said biasing power control means connected to said biasing power source is control means for setting the biasing RF power so as to adjust one of maximum, minimum, and average values of the potential corresponding to the potential on said processing surface of said substrate to be not more than the predetermined value by controlling the biasing RF power to have an envelope waveform similar to a relatively inverted waveform in response to an uneven change in potential corresponding to the potential generated on said processing surface of said substrate or potential corresponding to the generated potential when a biasing RF power having a predetermined amplitude is applied to said susceptor.

21. An apparatus according to claim 13, wherein said biasing power control means connected to said biasing power source is control means for setting the biasing RF power so as to adjust one of the maximum, minimum, and average values of the potential corresponding to the potential on said processing surface of said substrate to be not more than the predetermined value by controlling a frequency of the biasing RF power.

22. An apparatus according to claim 13, wherein said biasing power control means connected to said biasing power source is control means for setting a frequency of the biasing RF power so as to allow the biasing RF power to have an envelope waveform similar to a relatively inverted waveform in response to an uneven change in potential corresponding to the potential generated on said processing surface of said substrate when a biasing RF power having a predetermined amplitude is applied to said susceptor.

23. An apparatus according to claim 13, wherein said biasing power control means connected to said biasing power source is biasing power control means for controlling the biasing RF power so as to adjust one of the maximum, minimum, and average values of the potential corresponding to the potential on said processing surface of said substrate to be not more than the predetermined value, said bias power control means being control means for setting the biasing RF power to have a predetermined delay from an RF power pulse train to be applied to said plasma source.

* * * * *